(12) United States Patent
Aoshima

(10) Patent No.: US 7,226,715 B2
(45) Date of Patent: Jun. 5, 2007

(54) IMAGE RECORDING MATERIAL

(75) Inventor: Keitaro Aoshima, Shizuoka-ken (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 10/331,655

(22) Filed: Dec. 31, 2002

(65) Prior Publication Data

US 2003/0162121 A1 Aug. 28, 2003

(30) Foreign Application Priority Data

Jan. 8, 2002 (JP) .............................. 2002-001227

(51) Int. Cl.
G03F 7/037 (2006.01)
(52) U.S. Cl. .................. 430/157; 430/176; 430/278.1; 430/281.1
(58) Field of Classification Search ................ 430/157, 430/176, 281.1, 270.1, 278.1
See application file for complete search history.

(56) References Cited

U.S. PATENT DOCUMENTS

| | | | | |
|---|---|---|---|---|
| 4,081,572 A | * | 3/1978 | Pacansky | 430/300 |
| 4,416,973 A | * | 11/1983 | Goff | 430/281.1 |
| 4,803,147 A | * | 2/1989 | Mueller et al. | 430/288.1 |
| 5,198,325 A | * | 3/1993 | Hupfer et al. | 430/283.1 |
| 5,585,217 A | * | 12/1996 | Oba | 430/191 |
| 5,759,742 A | * | 6/1998 | West et al. | 430/278.1 |

FOREIGN PATENT DOCUMENTS

| | | |
|---|---|---|
| EP | 0940266 A1 | 9/1999 |
| EP | 0950515 A2 | 10/1999 |
| JP | 500102684 A1 * | 8/1975 |

\* cited by examiner

*Primary Examiner*—John S. Chu
(74) *Attorney, Agent, or Firm*—Sughrue Mion, PLLC

(57) ABSTRACT

The invention provides a negative image recording material comprising: a support and an image recording layer disposed on the support, the image recording layer comprising an amide-acid compound containing a carboxyl group and an amide group expressed by the following General Formula (1):

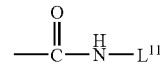

wherein $L^{11}$ represents a hydrogen atom or a hydrocarbon group having 30 or fewer carbon atoms which may have a substituent; and wherein the amide-acid compound is insolubilized by a thermal ring-closure reaction between the carboxyl group and the amide group.

The invention further provides a negative image recording material comprising a support, an image recording layer disposed on the support, the image recording layer containing a polymerization initiator and a polymerizable compound, and an overcoat layer disposed on the image recording layer, the overcoat layer containing the amide-acid compound expressed by the General Formula (1).

19 Claims, No Drawings

IMAGE RECORDING MATERIAL

BACKGROUND OF THE INVENTION

1. Field of the Invention

The present invention relates to planographic printing plate precursors, which has sensitivity to ultraviolet light rays, visible light rays or infrared light. More particularly, the present invention relates to a negative image recording material which can perform so-called "direct printing plate production" and can directly make a printing plate using a laser beam in accordance with a digital signal outputted from a computer or the like.

2. Description of the Related Art

Laser technology has remarkably advanced in recent years with widespread availability of high output and small-sized lasers utilizing ultraviolet rays, a visible light rays and infrared rays. These lasers are very useful as a light source for recording when printing plate making is performed by direct printing plate production in accordance with the digital data outputted from computers and the like (hereinafter, this direct printing plate production is referred to also as computer to plate, or CTP in short). Particularly, since solid state lasers and semiconductor lasers, which emit infrared rays having a wavelength of from 760 nm to 1200 nm, have high output compared with other wavelength regions, these lasers are very useful. Accordingly, in recent years these has been an increased demand for an image recording material which has a high sensitivity to such an infrared ray laser, that is, the image recording material, solubility in a developer of which is greatly changed by irradiation with the infrared ray.

In a negative image recording layer in such an the planographic printing plate precursor, there is a problem that, in one type which is cured by being exposed to light causing a polymerization reaction to proceed, the image recording layer has a relatively low strength before being cured and, in another type which contains a polymerizable low molecular weight compound, a support and the image recording layer adhere to each other easily; therefore, in either case, there is a problem that the image recording layer is easily damaged.

In a common writing method which utilizes visible light, an image forming reaction accurs, which utilizes light for either a laser exposure or a lamp exposure whereupon sufficient photoreaction occurs in the image recording layer up to a deep portion of the image recording layer in the vicinity of the support. Therefore, even when a scratch mark is formed only on a surface of the image recording layer, an image blank area is not generated. Only when a large scratch mark is formed, which reaches the deep portion, is an image defect such as the image blank area generated.

On the other hand, in a writing method of the invention, which utilizes such an infrared ray laser, image forming is performed by converting the infrared ray into heat and increasing a temperature of the image recording layer. In this method, particularly when a general support such as aluminum is used, due to thermal diffusion to the support having a high thermal conductivity, a sufficient temperature elevation cannot be achieved in the deep portion of the image recording layer while a sufficient temperature elevation can be achieved in the vicinity of a surface of the image recording layer whereupon a thermal reaction is efficiently performed. In a case of such an image forming mechanism, even when a shallow scratch mark is formed only in the vicinity of the surface of the image recording layer, since a curing reaction occurs and, further, a scratch mark is formed in a curing reaction region in the vicinity of the surface, which region will become a developing agent resistant region, the image blank area easily generated. Accordingly, an image forming material, to which a recording method using an infrared ray as in the invention is applied, is easily effected by a scratch mark such that image quality is easily deteriorated by the scratch mark, as compared with the writing method using visible light and the like.

Further, by present inventors found that, in a developing process for removing an unexposed portion by using an aqueous alkaline solution and performed after recording by light exposure, a decrease of film thickness in a region of an image portion clearly occured even though the decrease was small. It is assumed that, on the surface of the image recording layer in which image forming is most efficiently performed by polymerizarion reaction, a polymerization inhibition is generated by oxygen present in the atmosphere whereupon a portion in the vicinity of the surface, which portion is in sufficiently cured is generated and, accordingly, this insufficiently cured portion is dissolved and removed by the aqueous alkaline solution.

To prevent this image portion defect caused by a scratch mark and decrease of film thickness by poor curing, it is effective to provide a surface protective layer using a water-soluble resin having a low oxygen permeability or the like; however, when the protective layer is left intact on the surface of the image portion, since such a protective layer adversely affects an ink accepting property and, is also hydrophilic, there is a fear that stickiness will be generated on the surface in a storage environment, thereby deteriorating a working property.

SUMMARY OF THE INVENTION

The present invention solves the above-described problems. Accordingly, an object of the invention is to provide a negative image recording material which can be directly recorded from digital data outputted from a computer or the like by recording with a CTP output system, particularly, by using a solid state laser or a semiconductor laser which emits an infrared ray, and in which scratch marks on a surface thereof or a decrease of a film thickness at the time of development are suppressed and image quality of an obtained image to be obtained and printing durability are excellent.

The present inventors have focused on a negative image forming mechanism and, as a result of an intensive studies, have found that the above-described object can be attained by: preventing polymerization inhibition by oxygen present on the surface of the image recording layer by providing a compound, which becomes insoluble by heat, on the surface of the image recording layer of the negative image recording material, and, accordingly, allowing to function as an alkali developer resistant layer, thereby achieving the invention.

Namely, the negative image recording material according to the invention is characterized by comprising: a support and an image recording layer disposed on the support, the image recording layer comprising an acid-containing compound, the acid-containing compound containing at least one acid group that contributes to insolubilization of the image recording layer when the acid-containing compound is exposed to a heat source; on this occasion, as a compound contained in this image recording layer, specifically, a compound which has a carboxyl group and an amide group expressed by the following General Formula (1) and is insolubilized by a thermal ring-closure reaction between the carboxyl group and the amide group is preferable.

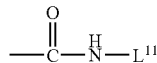

wherein $L^{11}$ represents a hydrogen atom or a hydrocarbon group having 30 or fewer carbon atoms which may have a substituent.

Specifically, the image recording material according to the invention can be characterized by comprising a support and an image recording layer disposed on the support, the image recording layer comprising an amide-acid compound, the amide-acid compound containing a carboxyl group and an amide group expressed by the following General Formula (1):

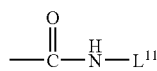

wherein $L^{11}$ represents a hydrogen atom or a hydrocarbon group having 30 or fewer carbon atoms which may have a substituent;

and wherein said amide-acid compound is insolubilized by a thermal ring-closure reaction between said carboxyl group and said amide group.

The term "insolubilized" as used herein is meant to refer to a phenomenon in which a compound generates a ring-closure reaction, a polymerization reaction or a cross-linking reaction whereupon solubility of the compound in a developer such as an aqueous alkaline solution for a negative image recording material, is decreased. Further, in the negative image recording material according to claim 3 of the invention, the term "comprising a compound, having a carboxyl group and an amide group expressed by a General Formula (1) described below in a molecule, which is insolubilized by a thermal ring-closure reaction on a surface of the image recording layer" is intended to include at least one of "a state in which (C) an amide-acid compound is unevenly distributed in the vicinity of a surface of an image recording layer" and "a state in which an overcoat layer having (C) an amide-acid compound is provided on a surface of an image recording layer".

It is preferable that the image recording material further comprise (D) a light absorbing agent and, among other things, a remarkable effect is effected when (D) the light absorbing agent is an infrared ray absorbing agent.

In the negative image recording material according to the invention, a compound having an acid group in a molecule which contributes to insolubilization by being denatured by heat is contained in an image recording layer. This compound is on a surface of the image recording layer, and solubility of the compound in an aqueous alkaline solution is decreased by heat and, when the compound is a low molecular weight compound, a cured thin film is formed while, when the compound is a polymer, a solid surface film is formed. In either case, the formed film functions as a surface protective layer.

Such functioning as the protective layer is remarkable, particularly when a photopolymerizable image recording layer according to the invention is provided. Namely, when (C) an amide-acid compound is present on the surface of the image recording layer, the compound in an exposed portion is quickly insolubilized by a ring-closure reaction to function as an oxygen blocking layer. Thus, polymerization inhibition by oxygen is suppressed, a curing reaction of (B) a polymerizable compound is allowed to be effectively proceeded, a sufficiently cured image portion having a high strength is formed, a surface thereof functions also as a permeation restraint layer against an alkali developer and, a decrease of a film thickness in an image portion is prevented. Thus, an image having a high image quality which has no blank area and an excellent printing durability can be formed.

Further, a compound, which has an acid group in a molecule that contributes to insolubilization by being denatured by heat, and (C) an amide-acid compound, which is a specific embodiment of this acid, are not insolubilized in an unexposed portion and washed away along with an uncured image recording layer by an alkali developer. Thus, developing properties are not inhibited.

DETAILED DESCRIPTION OF THE PREFERRED EMBODIMENTS

The present invention is described in detail below.

A negative image recording material according to the invention is characterized by comprising in an image recording layer a compound having an acid group in a molecule which contributes to insolubilization and is denatured by heat. Examples of this compound include compounds which are provided with an acid group such as a carboxyl group, a sulfonic acid group, a sulfuric acid group, a phosphonic acid group, a phosphoric acid group, a phenolic hydroxyl group or the like in a molecule and in which any one of these acid groups is decomposed by heat, thereby to be insolubilized by interacting with another, adjacent functional group in the molecule or to be insolubilized (specifically, by forming a film or the like) together with another coexisting compound present by interacting with a functional group thereof.

A specific example of such a compound having an acid group in a molecule which contributes to insolubilization by being denatured by heat include a compound having in a molecule a carboxyl group and an amide group, which is expressed by General Formula (1) described below. In this compound, the carboxyl group and the amide group perform a ring-closure reaction therebetween in a heating region, thereby making the compound insoluble.

In the image recording material according to the invention, an effect thereof is remarkable when a polymerizable compound is used as an image forming mechanism thereof. For this reason, using as a specific example a case in which a photopolymerizable compound is used, the negative image recording material according to the invention is described in detail below.

The negative image recording material according to the present embodiment is characterized in that an image recording layer having (A) a polymerization initiator and (B) a polymerizable compound is provided on a support and a surface of the image recording layer contains a compound which has (C) a carboxyl group and an amide group expressed by the General Formula (1) in a molecule and is made insoluble by a thermal ring-closure reaction being performed therebetween.

(C) Compound having Carboxyl Group and Amide Group Expressed by General Formula (1) in Molecule and Made Insoluble by Thermal Ring-Closure Reaction:

First, (C) an amide-acid compound, which is characteristic of the invention, will be described.

So long as this compound has a carboxyl group and an amide group expressed by General Formula (1) in a molecule, the compound may either be a low molecular weight compound or a polymer; however, it is preferable that the compound is a polymer, because of a good coating property thereof.

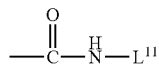

wherein $L^{11}$ represents a hydrogen atom or a hydrocarbon group having 30 or fewer carbon atoms and may have a substituent.

Examples of preferable substituents which can be introduced into the hydrocarbon group include a halogen atom, a nitro group, a cyano group, an alkoxy group having 12 or fewer carbon atoms and an aryloxy group having 12 or fewer carbon atoms.

Preferably, the carboxyl group and the amide group expressed by General Formula (1) are adjacent by being connected with two or three carbon atoms.

A scheme of an insolubilization reaction of the amide-acid compound is shown below.

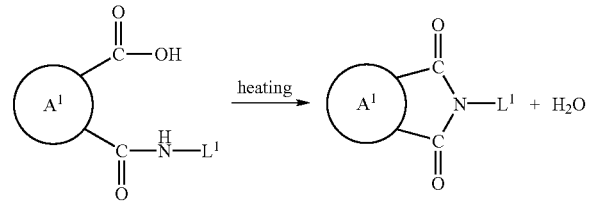

wherein $L^1$ represents an arbitrary substituent; and $A^1$ represents an arbitrary substituent which may form a ring. Before being heated, the compound is an amide-acid compound which has a carboxyl group and an amide group and is soluble in an aqueous alkaline solution. In this compound, the carboxyl group and the amide group perform a thermal ring-closure reaction therebetween to form an imide compound thereby making the compound insoluble in the aqueous alkaline solution.

When (C) the amide-acid compound is a low molecular weight compound, examples of a preferable low molecular weight compound, include compounds expressed by the following General Formula (2):

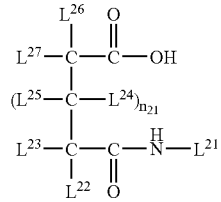

wherein $L^{21}$, $L^{22}$, $L^{23}$, $L^{24}$, $L^{25}$, $L^{26}$ and $L^{27}$ may be the same or different and each independently represent a hydrogen atom, a hydrocarbon group having 30 or fewer carbon atoms which may have a substituent or a covalent bond; preferable examples of such substituents include a halogen atom, a nitro group, a cyano group, an alkoxy group having 12 or fewer carbon atoms and an aryloxy group having 12 or fewer carbon atoms; a plurality of $L^{21}$ to $L^{27}$ may be bonded with one another to form a ring; and $n_{21}$ represents an integer of from 0 to 12, and preferably 0 or 1.

Specific examples (Example Compounds [AMT-1] to [ATM-7]) of preferable low molecular weight compounds according to the invention are described below, but the invention is by no means limited thereto.

[AMT-1]
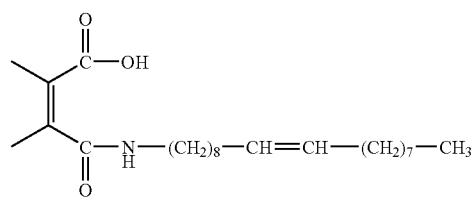

[AMT-2]
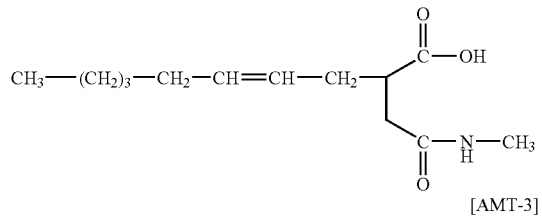

[AMT-3]
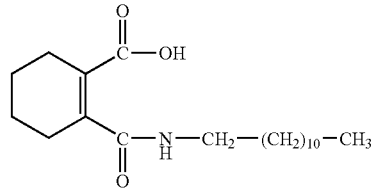

[AMT-4]
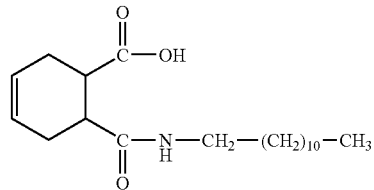

[AMT-5]
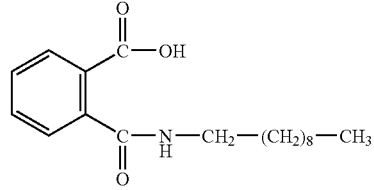

[AMT-6]
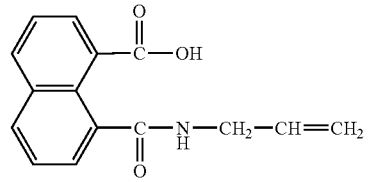

-continued

[AMT-7]

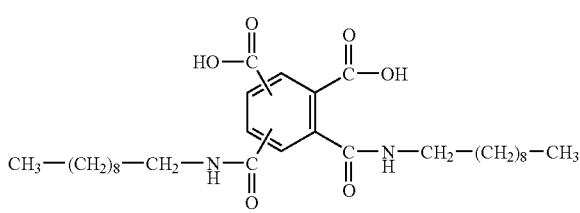

When (C) the amide-acid compound according to the invention is a polymer, examples thereof a polymer having a constitutional unit expressed by any one of the following General Formula (3)

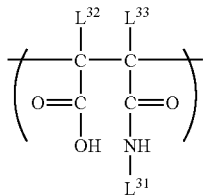

General Formula (3)

wherein $L^{31}$, $L^{32}$ and $L^{33}$ may be the same as or different from one another and each independently represents a hydrogen atom, a hydrocarbon group having 30 or fewer carbon atoms which may have a substituent or a covalent bond; preferable examples of substituents which can be introduced in the hydrocarbon group include a halogen atom, a nitro group, a cyano group, an alkoxy group having 12 or fewer carbon atoms and an aryloxy group having 12 or fewer carbon atoms.

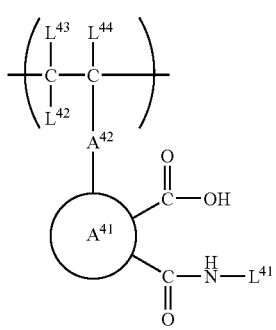

General Formula (4)

wherein $L^{41}$, $L^{42}$, $L^{43}$ and $L^{44}$ may be same or different and each independently represents a hydrogen atom or a hydrocarbon group having 30 or fewer carbon atoms which may have a substituent or a covalent bond; preferable examples of substituents which may be introduced in the hydrocarbon group include a halogen atom, a nitro group, a cyano group, an alkoxy group having 12 or fewer carbon atoms and an aryloxy group having 12 or fewer carbon atoms;

wherein $A^{41}$ represents a hydrocarbon group having 30 or fewer carbon atoms which may have a substituent or a covalent bond; preferable examples of substituents which may be introduced to the hydrocarbon include a halogen atom, a nitro group, a cyano group, an alkoxy group having 12 or fewer carbon atoms and an aryloxy group having 12 or fewer carbon atoms; and $A^{42}$ represents a covalent bond, an ester bond, an amide bond, an ether bond or a hydrocarbon group having 30 or fewer carbon atoms.

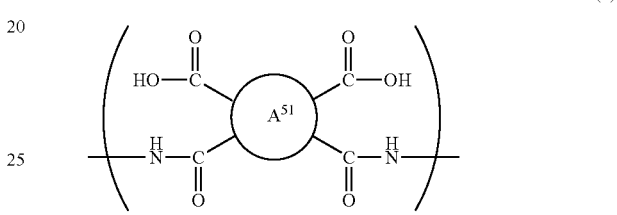

General Formula (5)

wherein $A^{51}$ represents a hydrocarbon group having 30 or fewer carbon atoms which may have a substituent or a covalent bonding; preferable examples of substituents which may be introduced in the hydrocarbon group include a halogen atom, a nitro group, a cyano group, an alkoxy group having 12 or fewer carbon atoms and an aryloxy group having 12 or fewer carbon atoms.

When (C) the amide-acid compound according to the invention is a polymer, a constitutional unit thereof which is capable of performing a ring-closure reaction is preferably in a range of from 1 mol % to 100 mol % and more preferably from 10 mol % to 80 mol %, of a constitutional unit of the polymer.

Further, as another constitutional unit, which is capable of performing copolymerization, includes an ordinary constitutional unit which is excellent in a film forming property and solubility in an aqueous alkaline solution; specifically, when the polymer includes a constitutional unit expressed by the General Formula (3) or (4),examples thereof include copolymerization units derived from (meth)acrylic acid esters, (meth)acrylamides, (meth)acrylic acid, styrene, butadiene, and isoprene. When the polymer includes a constitutional unit expressed by the General Formula (5), examples thereof include arylene such as phenylene, alkylene such as hexamethylene and xylylene as a preferable copolymerization unit. Further, in the present invention, (meth) acrylic acid indicates "one or both of acrylic acid and methacrylic acid".

Hereinafter, specific examples (illustrative compounds [AMP-1] to [AMP-10]) of preferable polymers according to the invention are described below, but the invention is by no means limited thereto.

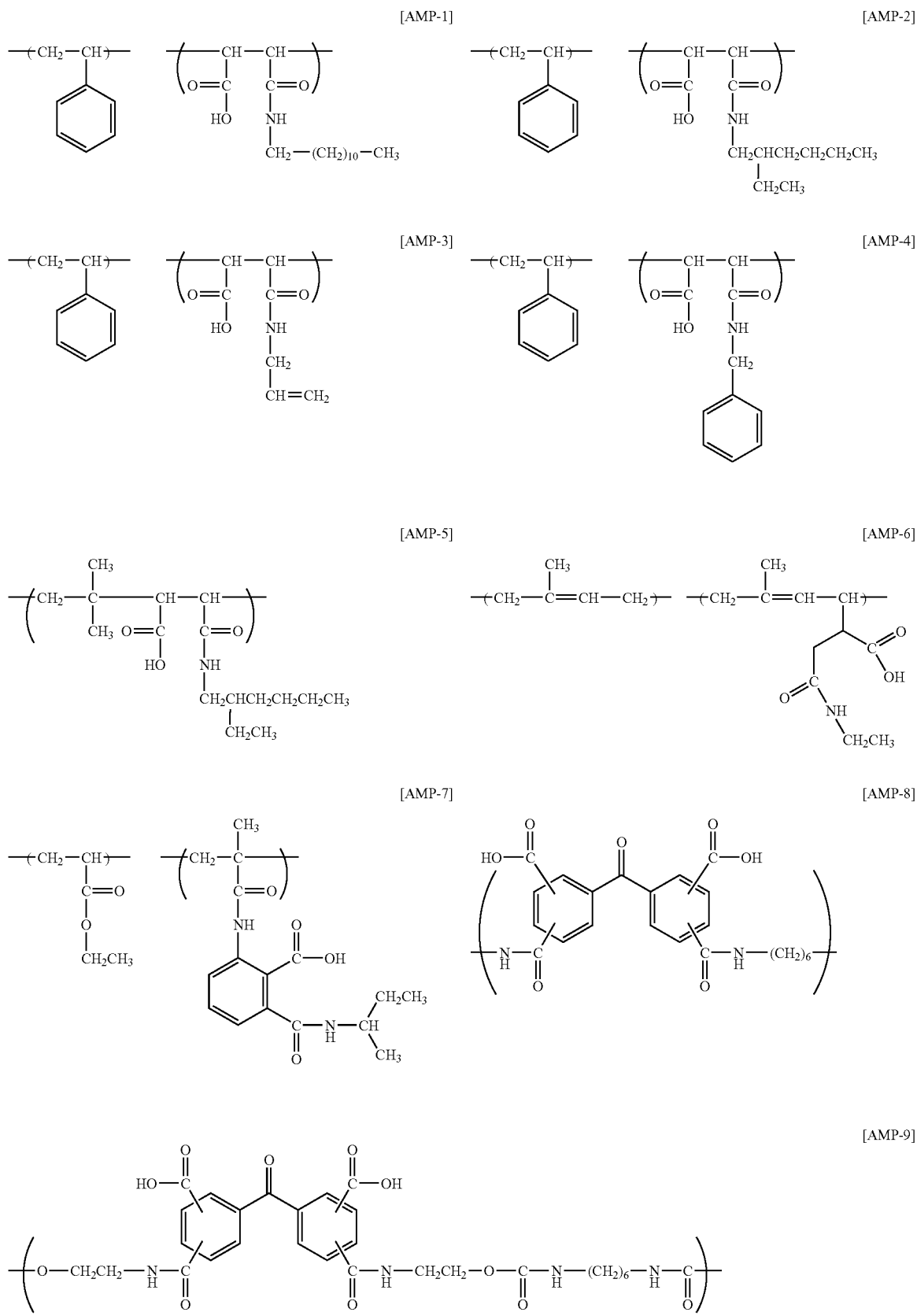

-continued

[AMP-10]

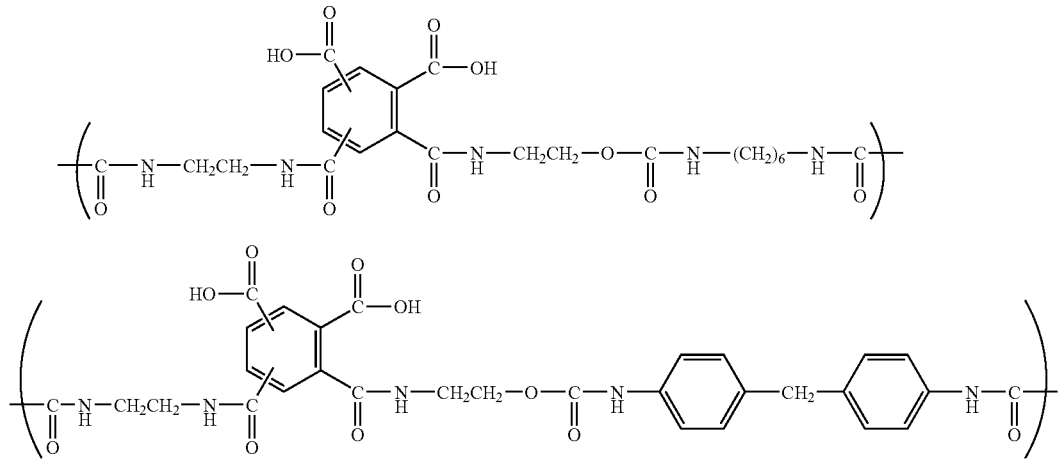

Here, in order to allow (C) the amide-acid compound to be contained on the surface of the image recording layer, after the image recording layer to be described below is formed, a layer containing the amide-acid compound may be applied as an overcoat layer; however, by making (C) the amide-acid compound in a coating liquid for the image recording layer and then applying the resultant coating liquid (C) the amide-acid compound can also be contained on the surface of the image recording layer by, since this compound is unevenly distributed on the surface of the image recording layer due to a function of an amide group expressed by the General Formula (1).

When (C) the amide-acid compound is allowed to be contained in the image recording layer as in a latter case described above, (C) the amide-acid compound may be added to a coating liquid for the image recording layer, which coating liquid contains other constitutional components to be described below, such as (A) a radical generating agent, (B) a radical polymerizable compound and the like; in this case, a quantity thereof to be added is preferably in a range of from approximately 0.1% by mass to approximately 50% by mass and more preferably in a range of from approximately 0.5% by mass to approximately 50% by mass, based on an entire solid content of the coating liquid for the image recording layer, and thickness of the image recording layer in this case is preferably in a range of from 0.1 g/m² to 5.0 g/m² and more preferably in a range of from 0.5 g/m² to 3.0 g m².

Such uneven distribution of (C) the amide-acid compound in this image recording layer can be confirmed by methods such as measuring a contact angle of the surface of the image recording layer, observing a cross-section of the image recording layer under an electron microscope and the like.

When a layer containing (C) the amide-acid compound is allowed to be the overcoat layer as in the former case described above, a quantity of (C) the amid-acid compound to be added in a coating liquid for the overcoat layer is preferably in a range of from 0.1% by mass to 50% by mass and more preferably in a range of from 0.5% by mass to 50% by mass, and thickness of the overcoat layer is preferably in a range of from 0.1 g/m² to 3.0 g/m² and more preferably in a range of from 0.5 g/m² to 1.0 g/m².

When a content of (C) the amid-acid compound is within the above-described preferable range, enhancement of image formability and printing durability can be attained. When the content is overly small, an effect of enhancing the printing durability becomes insufficient, and, when the content is overly large, a further improved effect are not seen and there is a tendency for the image formability to decrease.

These (C) amid-acid compounds are rapidly cured by being heated at 100° C. or more by an infrared laser at an exposure region; however, since a curing reaction thereof is a ring-closure reaction, it is not influenced by oxygen. Further, (C) the amide-acid compound is advantageous in that, since (C) the amide-acid compound itself allows an exposure light supply to pass therethrough, it does not inhibit a polymerization reaction in a deep portion of the image recording layer, and functions only as an oxygen blocking layer or an alkali resistant developing layer, thus it does not adversely effect image forming properties.

Next, other constitutional components of the image recording material according to the invention is described.

According to the invention, an image recording layer containing (A) a polymerization initiator and (B) a polymerizable compound is used. This negative of the image recording layer contains (A) the polymerization initiator and (B) the polymerizable compound which cures by a polymerization reaction caused by a radical generated by the radical generating agent and, preferably contains (D) an infrared absorbing agent and (E) a binder polymer. Preferably, a radical generating agent (radical polymerization initiator) is used as the (A) the polymerization initiator. Further, a radical polymerizable compound, which cures by a polymerization reaction caused by a radical generated by the radical generating agent, is preferably used as the (B) polymerizable compound. In this image recording layer, the radical polymerization initiator such as an onium salt or the like is decomposed by heat within a region of heating or exposure to generate a radical. The radical polymerizable compound is selected from compounds which each have at least one ethylenic unsaturated double bond and at least one, and preferably two or more, terminal ethylenic unsaturated bonds and cures by a polymerization reaction continuously effected by the thus-generated radical to form an image portion.

Radical Generating Agent

Examples of a radical generating agent favorably used according to the invention include onium salts and, specific examples of such onium salts include iodonium salts, diazonium salts and sulfonium salts. These onium salts have a function as an acid generating agent and, when these salts are simultaneously used with a radical polymerizable compound to be described below, the salts function as the radical polymerization initiator. The onium salt which is favorably used according to the invention is selected from such onium salts as expressed by the following General Formulas (III) to (V):

General Formula (III):

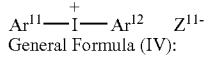

General Formula (IV):

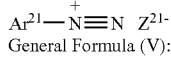

General Formula (V):

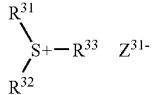

In General Formula (III) $Ar^{11}$ and $Ar^{12}$ each independently represents an aryl group having 20 or fewer carbon atoms which may have a substituent; examples of preferable substituents which this aryl group may have include a halogen atom, a nitro group, an alkyl group having 12 or fewer carbon atoms, an alkoxy group having 12 or fewer carbon atoms and aryloxy group having 12 or fewer carbon atoms; and $Z^{11}$ represents a counter ion selected from the group consisting of: a halogen ion, a perchloric ion, a tetrafluoroborate ion, a hexafluorophosphate ion and a sulfonic ion and preferably represents the perchloric ion, the hexafluorophosphate ion and an arylsulfonic ion.

In General Formula (IV), $Ar^{21}$ represents an aryl group having 20 or fewer carbon atoms which may have a substituent; on this occasion, examples of preferable substituents include a halogen atom, a nitro group, an alkyl group having 12 or fewer carbon atoms, an alkoxy group having 12 or fewer carbon atoms, aryloxy group having 12 or fewer carbon atoms, an alkylamino group having 12 or fewer carbon atoms, a dialkylamino group having 12 or fewer carbon atoms, an arylamino group having 12 or fewer carbon atoms and a diarylamino group having 12 or fewer carbon atoms; and $Z^{21-}$ represents a counter ion synonymous with $Z^{11-}$.

In the General Formula (V), $R^{31}$, $R^{32}$ and $R^{33}$ may be the same as or different from one another and represent a hydrocarbon group having 20 or fewer carbon atoms which may have a substituent; examples of preferable substituents include a halogen atom, a nitro group, an alkyl group having 12 or fewer carbon atoms, an alkoxy group having 12 or fewer carbon atoms and aryloxy group having 12 or fewer carbon atoms; and $Z^{31-}$ represents a counter ion synonymous with $Z^{11-}$.

Specific examples of onium salts, which can be favorably used according to the invention, include those described in paragraphs [0030] to [0033] of Japanese Patent Application No. 11-310623.

The onium salts to be used according to the invention have a maximum absorption wavelength of preferably 400 nm or less and more preferably 360 nm or less-. By making absorption wavelength be in an ultraviolet ray region, an a planographic printing plate precursor can be handled under a white light.

These onium salts can be added to the coating liquid for the image recording layer at a ratio of from 0.1% by weight to 50% by weight, preferably from 0.5% by weight to 30% by weight and particularly preferably from 1% by weight to 20% by weight, based on an entire solid content of the coating liquid for the image recording layer. When the onium salt quantity to be added is less than 0.1% by weight, sensitivity is decreased and when the quantity is more than 50% by weight, a smudge is generated in a non-image portion at the time of printing. These onium salts may be used either each individually or in combinations of two or more. These onium salts may be added to the same layer as another component, or to a different layer after the different layer is provided.

Radically Polymerizable Compound

A radical polymerizable compound to be used in the image recording layer according to the invention has at least one ethylenic unsaturated double bond and is selected from a group consisting of compounds which each have at least one, and preferably two or more, terminal ethylenic unsaturated bonds. Such a group of compounds is well known in the art and can be used according to the invention without any specific restrictions. These compounds each are in a chemical state of, for example, a monomer, a prepolymer, that is, a dimer, a trimer, an oligomer, a mixture thereof, a copolymer thereof or the like. Examples of monomers and copolymers thereof include an unsaturated carboxylic acid (for example, acrylic acid, methacrylic acid, itaconic acid, crotonic acid, isocrotonic acid, maleic acid or the like), esters or amides of the above-described acids; preferably an ester of an unsaturated carboxylic acid and an aliphatic polyvalent alcohol compound, and an amide of an unsaturated carboxylic acid and an aliphatic polyvalent amine compound can be used. Further, an addition reaction product of an ester or amide of an unsaturated carboxylic acid having a nucleophilic substituent such as a hydroxyl group, an amino group, a mercapto group or the like and a monofunctional or multifunctional isocyanate or epoxy, a dehydration-condensation reaction product of such an ester or amide and a monofunctional or multifunctional carboxylic acid and the like can also be favorably used. Further, an addition reaction product of an ester or amide of an unsaturated carboxylic acid having an electrophilic substituent such as an isocyanate group, an epoxy group or the like and a monofunctional or multifunctional alcohol, amine or thiol, and further, a substitution reaction product of an ester or amide of an unsaturated carboxylic acid having an desorption-type substituent such as a halogen group, tosyloxy group or the like, and a monofunctional or multifunctional alcohol, amine or thiol are favorably used. Furthermore, as another example, a group consisting of compounds in which the above-described unsaturated carboxylic acid is changed over to an unsaturated phosphonic acid, styrene or the like can be used.

Specific examples of the radical polymerizable compounds, each of which is an ester of an aliphatic polyvalent alcohol and an unsaturated carboxylic acid, include an acrylic acid ester, a methacrylic acid ester, an itaconic acid ester, a crotonic acid ester, an isocrotonic acid ester and a maleic acid ester, and are described in paragraphs [0037] to [0042] of Japanese Patent Application No. 11-310623; these examples are also applicable to the invention.

As examples of other esters than described above, for example, aliphatic alcohol-type esters described in JP-B Nos. 46-27926, 51-47334, and JP-A No. 57-196231, esters each having an aromatic skeleton described in JP-A Nos. 59-5240, 59-5241, and 2-226149, and esters each having an amino group described in JP-A No. 1-165613 and the like can favorably be used.

Further, a urethane-type addition polymerizable compound which is produced by an addition reaction of an isocyanate and a hydroxyl group can be favorably used; in this case, specific examples of such urethane-type addition polymerizable compounds include a polyisocyanate compound having two or more isocyanate groups in a molecule as described in JP-B No. 48-41708, a vinyl urethane compound, having two or more polymerizable vinyl groups in a molecule, which has been added with a vinyl monomer having a hydroxyl group expressed by the following General Formula (VI) and the like:

General Formula (VI)

(wherein $R^{41}$ and $R^{42}$ each independently represents H or $CH_3$.)

Details of application methods of these radical polymerizable compound as to, for example, what type of structure is used, whether they are used individually or simultaneously, what quantity is used and the like, can be arbitrarily defined depending on a performance design of a final recording material. For example, a selection can be made from the standpoint described below. From the standpoint of sensitivity, a structure in which a content of the unsaturated group in a molecule is large is preferable; on this occasion, a structure having two or more functional groups is preferable in many cases. Further, in order to enhance strength of an image portion, that is, a cured film, a structure having three or more functional groups is preferable and, further, a method of adjusting both sensitivity and strength by combining compounds (for example, acrylic acid ester-type compound, methacrylic acid ester-type compound, styrene-type compound and the like) which are different in a functional number and a polymerizable group-type from one another is effective. There is a case in which a compound having a large molecular weight or a compound having a high hydrophobic property is excellent in sensitivity or film strength, but this compound is unpreferable in views of a development speed or a precipitation problem in a developer. Further, any one of a selection and an application method of a radical polymerizable compound is an important factor to solubility or dispersibility with other components (for example, binder polymer, initiator, coloring agent and the like) in the image recording layer; on this occasion, for example, using a low-purity compound or simultaneously using two or more types of compounds may sometimes enhance the solubility. Further, for the purpose of enhancing adhesiveness to a support, an overcoat layer and the like, a specified structure can be selected.

As to a compounding ratio of the radical polymerizable compound in the image recording layer, the higher the ratio becomes, the more advantageous the sensitivity becomes; however, when the ratio is excessively high, problems occurs in that an unpreferable phase separation is generated, a problem of a production process to be derived from adhesiveness of the image recording layer is generated (for example, production deficiency derived from transferring or adhesion of a component of the image recording layer), a precipitation from a developer is generated and the like.

Under these circumstances, a preferable compounding ratio of the radical polymerizable compound is, in many cases, from 5% by mass to 80% by mass and preferably from 20% by mass to 75% by mass, based on an entire component of a composition. Further, such radical polymerizable compounds may be used individually or in mixtures of two or more. There are methods other than those described above in which an appropriate structure, compounding, a quantity to be added and the like can be arbitrarily selected from the standpoint of large or small polymerization inhibition by oxygen, resolution, fog, refractive index change, surface adhesiveness and the like and, further, in some cases, at least one of a layer constitution and an application method, such as an undercoat or an overcoat, can be performed.

(D) Light Absorbing Agent

Since an image is formed in response to an ultraviolet ray, a visible light ray or an infrared light ray according to the invention, it is preferable that a light absorbing agent is contained in an image recording layer. The light absorbing agent to be used according to the invention is a compound which absorbs an ultraviolet ray, a visible light ray or an infrared ray and generates a radical when combined with a radical generating agent. In regard to such combinations, examples of initiators which show sensitivity in an ultraviolet region, include acetophenones, benzoins, benzophenones, and thioxanthones.

Examples of initiators which show sensitivity in a visible light region include a combination of an organic peroxide and a chlorophyll, a combination of an organic peroxide and an eosin G, a combination of an organic peroxide and riboflavin, a combination of an organic peroxide and methylene blue, a combination of an organic peroxide and a (thio)pyrylium salt, a combination of an organic peroxide and a merocyanine, a combination of an organic peroxide and a quinoline, a combination of an organic peroxide and a styrylquinone, a combination of an organic peroxide and a (thio)xanthene-type dye, a combination of an organic peroxide and riboflavin tetrabutylate, a combination of an organic peroxide and a (keto)coumarin-type dye, a combination of an organic peroxide, N-phenylglycin and a thioxanthene-type dye, a combination of a diphenyliodonium salt and a merocyanine dye, a combination of a diphenyliodonium salt and a polymer of a rhodamine derivative, a combination of a diphenyliodonium salt and a ketocoumarin-type dye, a combination of a diphenyliodonium salt and a tetraphenylporphyrin-type dye, a combination of a diphenyliodonium salt and a tetrabenzophenylporphyrin-type dye, a combination of a diphenyliodonium salt and a spiropyran, a combination of a diphenyliodonium salt, N-phenylglycin and a thioxanthene-type dye, a combination of a diphenyliodonium salt, N-phenylglycin and a merocyanine-type dye, a cyanine-type dye, an alkylborate of a cyanine-type dye, an alkylborate of a rhodamine-type dye, an alkylborate of a methylene blue-type dye, an iron arene complex, a combination of an iron arene complex and a ketocoumarin-type dye, a combination of an iron arene complex and a thioxanthene-type dye, a fluorine-substituted titanocene, a combination of a bisimidazole and an arylidene aryl ketone, a combination of a bisimidazole and a ketocoumarin-type dye, a combination of N-phenylglycin and a ketocoumarin-type dye, a combination of N-phenylglycin and (thio)xanthene-type dye, a tris(trichloromethyl)-s-triazine derivative, a combination of a tris(trichloromethyl)-s-triazine derivative and a merocyanine-type dye, a combination of a tris(trichloromethyl)-s-triazine derivative and a ketocoumarin-type dye, a combination of a tris(trichloromethyl)-s-triazine derivative and a thiopyrylium salt, a combination of a tris(trichloromethyl)-s-triazine derivative and a thioxanthene-type dye, a combination of an amino benzoic acid ester and riboflavin tetrabutylate, and a combination of 2-mercaptobenzoimidazole and a thiopyrylium salt.

Examples of initiators having sensitivity to a near-infrared light include a salt of a cationic dye having an absorption property in a near-infrared region, a combination of a cationic dye having an absorption property in a near-infrared region and an ammonium salt, a combination of a cationic dye having an absorption property in a near-infrared region, and a triazine compound and an ammonium salt.

When the image recording layer of the planographic printing plate precursor according to the invention is subjected to a recording operation by a laser which emits an infrared ray, it is preferable from the standpoint of enhancement of sensitivity to add (D) a light absorbing agent (photothermal converting agent) which has a function of converting an infrared light used for exposure into heat. As such light absorbing agent, a dye or a pigment which particularly has an absorption maximum in a wavelength range of from 760 nm to 1200 nm is preferable. The light absorbing agent (infrared ray absorbing agent) having absorption in an infrared region will be described in detail below.

Examples of such dyes include commercially available dyes and known dyes as described in "Handbook of Dyes" (edited by The Society of Synthetic Organic Chemistry, Japan, 1970) and the like, and, specifically, dyes described in paragraphs [0050] to [0051] of JP-A No. 10-39509.

Among these dyes, mentioned are favorably cyanine dyes, squariliumdyes, pyrylium salts and nickel-thiolate complexes, more favorably the cyanine dyes and most favorably the cyanine dyes expressed by the following General Formula (1):

General Formula (1)

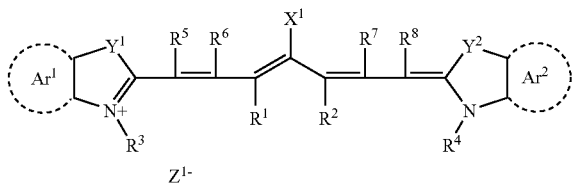

wherein $X^1$ represents a hydrogen atom, $X^2$-$L^1$ or $NL^2L^3$; $X^2$ represents an oxygen atom or a sulfur atom; $L^1$ represents a hydrocarbon group having from 1 to 12 carbon atoms; and $L^2$ and $L^3$ each independently represents a hydrocarbon group having from 1 to 12 carbon atoms;

$R^1$ and $R^2$ each independently represents a hydrocarbon group having from 1 to 12 carbon atoms; on this occasion, from storage stability of the coating liquid for the recording layer, it is preferable that $R^1$ and $R^2$ each independently represent a hydrocarbon group having 2 or more carbon atoms and particularly preferable that $R^1$ and $R^2$ are combined with each other to form a 5- or 6-membered ring;

$Ar^1$ and $Ar^2$ may be the same or different and each independently represents an aromatic hydrocarbon group which may have a substituent;

$Y^1$ and $Y^2$ may be the same or different and each independently represents a sulfur atom or a dialkylmethylene group having 12 or fewer carbon atoms;

$R^3$ and $R^4$ may be the same as or different from each other and each independently represents a hydrocarbon group having 20 or fewer carbon atoms which may have a substituent; examples of such substituents include an alkoxy group, a carboxyl group and a sulfo group;

$R^5$, $R^6$, $R^7$ and $R^8$ may be the same or different and each independently represents a hydrogen atom or a hydrocarbon group having 12 or fewer carbon atoms; from the standpoint of availability of a raw material, a hydrogen atom is preferable; and $Z^{1-}$ represents a counter anion; when any of $R^1$ to $R^8$ is substituted with a sulfo group, $Z^{1-}$ is not necessary; from the standpoint of storage stability of the coating liquid for the recording layer, preferable examples of $Z^{1-}$ include a halogen ion, a perchloric acid ion, a tetrafluoborate ion, a hexafluorophosphate ion, a sulfonic acid ion and particularly preferably a perchloric acid ion, a hexafluorophosphate ion and an arylsulfonic acid ion.

Specific examples of cyanine dyes expressed by the General Formula (1) which can favorably used according to the invention, include dyes described in paragraphs [0017] to [0019] of Japanese Patent Application No. 11-310623.

Examples of dyes to be used in the invention include commercially available dyes and dyes described in a Color Index (C. I.) Handbook, "Handbook of Modern Pigments" (Saishin Ganryo Binran) (edited by the Pigment Technology Association of Japan (Nippon Ganryo Gijutsu Kyokai), 1977), "Modern Pigment Application Techniques" (Saishin Ganryo Oyo Gijutsu) (published by CMC Publishing Co., Ltd., 1986) and "Printing Ink Technology" (Insatsu Inki Gijutsu) (published by CMC Publishing Co., Ltd., 1984).

Examples of types of pigment include black pigments, yellow pigments, orange pigments, brown pigments, red pigments, purple pigments, blue pigments, green pigments, fluorescent pigments, metallic powder pigments, etc., and polymer-coupled coloring dyes. Details of these pigments are described in paragraphs [0052] to [0054] of JP-A No. 10-39509 and these pigments are also applicable to the invention. Among these pigments, carbon black is preferable.

A quantity of the above-described dyes and pigments to be contained in the image recording layer is preferably from 0.01% by mass to 50%, more preferably from 0.1% to 10% and most preferably from 0.5% to 10% for dyes and from 1.0% to 10% for pigments, relative to total weight of the solid content of the image recording layer.

In the above-described range of the quantity of the dyes and pigments to be contained, preferable sensitivity can be attained. When the quantity to be added is too low, an effect of enhancing the sensitivity cannot sufficiently be obtained, while, when the quantity to be added is too high, a smudge is sometimes generated in a non-image portion of the planographic printing plate precursor.

(E) Binder Polymer

According to the invention, it is preferable to also add a binder polymer to an image recording layer from the standpoint of enhancing a film-making property. It is preferable to use a linear organic polymer as a binder. As such a "linear organic polymer", any linear organic polymer may be used. However, in order to be able to water develop or alkalescent water develop, a water- or alkalescent water-soluble or swellable linear organic polymer is preferably selected. The linear organic polymer is not only used as a film-forming agent for forming the image recording layer but is also selected in accordance to its use as a water, alkalescent water or organic solvent developer. For example, when a water-soluble organic polymer is used, water development can be performed. Examples of such linear organic polymers include radical polymers having a carboxylic acid group on a side chain thereof, such as methacrylic acid copolymers, acrylic acid copolymers, itaconic acid copolymers, crotonic acid copolymers, maleic acid copolymers, partially esterified maleic acid copolymers and the like as described in JP-A No. 59-44615, JP-B No. 54-34327, JP-B No. 58-12577, JP-B No. 54-25957, JP-A Nos. 54-92723, 59-53836, and 59-71048. Also, acidic cellulose derivatives similarly each having a carboxylic acid group on a side chain thereof may be used. Further, linear organic polymers obtained by adding a cyclic acid anhydride to a polymer having a hydroxyl group are useful.

In particular, among these compounds, a (meth)acrylic resin having a carboxyl group on a side chain and a benzyl group or an allyl group, has an excellent balance among film strength, sensitivity and developability, and is suitably used.

Furthermore, urethane-based binder polymers containing an acid group as described in JP-B Nos. 7-12004, 7-120041, 7-120042, and 8-12424, JP-A Nos. 63-287944, 63-287947, and 1-271741, Japanese Patent Application No. 10-116232 and the like have very excellent strength and are advantageous in view of printing durability and suitability for low intensity exposure.

In addition to these examples, polyvinyl pyrrolidone, polyethylene oxide and the like are useful as the water-soluble linear organic polymer. For the purpose of increasing strength of a cured film, an alcohol-soluble nylon, a polyether of 2,2-bis-(4-hydroxyphenyl)propane and epichlorohydrin, and the like are useful.

A weight average molecular weight of a polymer to be used according to the invention is preferably 5000 or more and more preferably in a range of from 10000 to 300000, while a number average molecular weight is preferably 1000 or more and more preferably in a range of from 2000 to 250000. A degree of polydispersion (weight average molecular weight/number average molecular weight) is preferably 1 or more and more preferably in a range of from 1.1 to 10.

These polymers may be any of a random polymer, a block polymer, a graft polymer and the like, but are preferably a random polymer.

Binder polymers, which are used according to the invention, may be used alone or in combination thereof. These polymers are added to the image recording layer at a ratio of from 20% by weight to 95% by weight and preferably from 30% to 90% by weight, based on a total solid content of the coating liquid for the image recording layer. When a quantity thereof to be added is less than 20% by weight, strength of an image portion is insufficient at the time an image is formed, while, when a quantity thereof to be added is more than 95% by weight, an image is not formed. Further, a weight ratio of a compound having an ethylenic unsaturated double bond capable of being radical polymerizable and a linear organic polymer is preferably in a range of from 1/9 to 7/3.

Other Components

According to the invention, various types of known compounds may be added to the image recording material as additives as occasion demands. For example, a dye having a large absorbance in the visible light region can be used as a coloring agent of the image. Further, pigments such as a phthalocyanine-type pigment, an azo-type pigment, carbon black, titanium oxide and the like can also be preferably used.

It is preferable to add these coloring agents, since they allow to easily distinguish the image portion from the non-image portion after the image is formed. A quantity thereof to be added is from 0.01% by weight to 10% by weight, based on an entire solid content of the coating liquid for the image recording layer.

Further, in the invention, when the image recording layer is a photo polymerization layer, it is preferable that a small quantity of a thermal polymerization inhibitor is added to prevent a compound, which has an ethylenic double bond capable of being radical polymerized, from being subjected to an unnecessary thermal polymerization during a preparation or storage of the coating liquid. Examples of appropriate thermal polymerization inhibitors include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and N-nitroso-N-phenylhydroxylamine aluminum salts. A quantity of the thermal polymerization inhibitor to be added is preferably from about 0.01% by weight to about 5% by weight, based on the weight of the total composition. Also, if desired, in order to prevent polymerization inhibition by oxygen, a higher fatty acid derivative such as behenic acid or behenic acid amide may be added and dispersed unevenly on the surface of the image recording layer during the drying process after coating is performed. A quantity of the higher fatty acid derivative to be added is preferably from about 0.1% by mass to about 10% by mass, based on the total composition.

Further, in order to broaden processing stability with respect to developing conditions, nonionic surfactants as described in JP-A Nos. 62-251740 and 3-208514 or amphoteric surfactants described in JP-A Nos. 59-121044 and 4-13149 can be added to the coating liquid for the image recording layer according to the invention.

Specific examples of the nonionic surfactants include sorbitan tristearate, sorbitan monopalmitate, sorbitan trioleate, stearic acid monoglyceride, and polyoxyethylene nonylphenyl ether.

Specific examples of the amphoteric surfactants include alkyl di(aminoethyl)glycine, a hydrochloric acid salt of alkyl polyaminoethyl glycine, 2-alkyl-N-carboxyethyl-N-hydroxyethyl imidazolinium betaine, and N-tetradecyl-N,N-betaine-types (for example, Amogen K (trade name) available from Dai-ichi Kogyo Co., Ltd.).

A ratio of any of the nonionic surfactants and the amphoteric surfactants to be contained in the coating liquid for the image recoding layer is preferably in a range of from 0.05% to 15% by mass and more preferably in a range of from 0.1% to 5% by mass.

Further, if necessary, a plasticizer may be added to the coating liquid for the image recording layer according to the invention in order to impart flexibility to a coating film. Examples of such plasticizers include polyethylene glycol, tributyl citrate, diethyl phthalate, dibutyl phthalate, dihexyl phthalate, dioctyl phthalate, tricresyl phosphate, tributyl phosphate, trioctyl phosphate, and tetrahydrofurfuryl oleate.

In order to prepare the image recording material according to the invention, ordinarily, the above-described components necessary for the coating liquid for the image recording layer are dissolved in a solvent and, then, the resultant solution is applied on a support. Examples of such solvents to be used on this occasion include ethylene dichloride, cyclohexanone, methyl ethyl ketone, methanol, ethanol, propanol, ethyleneglycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene, and water. However, the invention is not limited to these examples. These solvents may be used each individually or in any combination thereof. A concentration of the above-described components (a total solid content including additives) in the solvent is preferably from 1% by mass to 50% by mass.

Further, a quantity (solid content) of the image recording layer applied on the support to be obtained after coating and drying operations varies according to uses, but is generally preferably from 0.5 g/m$^2$ to 5.0 g/m$^2$ for the photosensitive printing plate precursor. A coating method is not particularly limited, and various coating methods can be used. Examples of such coating methods include bar coating, rotational coating, spray coating, curtain coating, dip coating, air-knife coating, blade coating, and roll coating. As the quantity to be applied is reduced, the apparent sensitivity increases, but film characteristics of the image recording layer which perform functions of image deteriorate.

Support

In the planographic printing plate precursor comprising the image recording layer according to the invention, a support which can be coated with the above-described image recording layer and an overcoat layer, which is optionally provided, and contains (C) an amide-acid compound, is a dimensionally stable plate-shaped material. Examples of such supports include paper, paper laminated with plastic (for example, polyethylene, polypropylene, polystyrene or the like), metal plates (such as aluminum, zinc, copper or the like), plastic films (such as diacetyl cellulose, triacetyl cellulose, cellulose propionate, cellulose butyrate, cellulose butyrate acetate, cellulose nitrate, polyethylene terephthalate, polyethylene, polystyrene, polypropylene, polycarbonate, and polyvinyl acetal or the like), and paper or plastic films which are laminated or vapor-deposited with the above-described metals. Among these materials, polyester films or aluminum plates are preferable as the support.

It is preferable to use an aluminum plate which is light weight and excellent in a surface treatment property, processability and corrosion resistance as a support to be used in the image recording material according to the invention. Examples of qualities of aluminum material for use with this objective include materials specified by JIS 1050 (namely, Al alloys comprising 99.5% or more of Al, 0.30% of Fe, 0.10% of Si, 0.02% of Ti, 0.013% of Cu), Al—Mg alloys, Al—Mn alloys, Al—Mn—Mg alloys, Al—Zr alloys, and Al—Mg—Si alloys.

The aluminum plate can be subjected to a surface treatment such as a surface roughening treatment and the like on a surface thereof and, then, applied with an image recording layer to form the planographic printing plate precursor. The surface roughening treatment of the aluminum plate is performed by various methods, for example, a method of mechanically roughening the surface, a method of chemically roughening the surface, a method of electrochemically roughening the surface and the like, either alone or in any combination thereof. Further, in order to secure a scratch resistance of the surface, it is preferable to perform an anodization treatment on the surface or a treatment for enhancing hydrophilic property thereof.

The surface treatment of the support is described in detail below.

If desired, a degreasing treatment may be performed, for example, with a surface active agent, an organic solvent, an aqueous alkaline solution or the like before performing a surface roughening treatment on the aluminum plate so as to remove rolling oil from the surface. When the aqueous alkaline solution is used, a treatment such as neutralization by an acidic solution, desmutting or the like can subsequently be performed.

Next, in order to enhance adhesiveness between the support and the image recording layer and also impart a non-image portion with a water-retention property, a roughening treatment on the surface of the support, that is, a graining treatment is performed on the surface of the support. As a specific example of the graining treatment, known methods can be used such as a mechanical graining method by using sandblasting or the like, a chemical graining method in which the surface is subjected to the graining treatment by an etching agent comprising an alkali, an acid or a mixture thereof, an electrochemical graining method, a method of roughening the surface by adhering a support material with a grainy body by using an adhesive or a method having an adhesive effect, a method of roughening the surface by pressing a continuous belt or roll having a fine irregularities against the support material allowing the irregularities to be transferred to the surface of the support material and the like.

These methods of roughening the surface may be combined with one another and an order thereof, a number of repetition, and the like, of the methods can optionally be selected. Since smut is generated on the surface of the support which was subjected to such method of roughening treatment or graining treatment as described above, it is ordinarily preferable that, in order to remove the smut, an appropriate rinsing with water, an alkali etching or another treatment is performed.

When an aluminum support according to the invention is used, after the above-described pretreatment is performed thereon, an anodizing treatment is ordinarily performed on the thus-pretreated aluminum support to form an oxide film thereon to increase abrasion resistance, chemical resistance and water retention.

Any electrolyte may be used in performing the anodizing treatment on the aluminum plate so long as it produces a porous oxide film. Generally, sulfuric acid, phosphoric acid, oxalic acid, chromic acid, or any mixture thereof can be used as the electrolyte. A concentration of the electrolyte may appropriately be determined, depending on the type of the electrolyte. Conditions for the anodizing treatment vary depending on the type of electrolyte employed and cannot be stipulated unqualifiedly. However, generally the conditions appropriately applied are as follows: the concentration of an electrolyte solution is from 1% to 80%; a temperature of the solution is from 5° C. to 70° C.; a current density is from 5 A/dm$^2$ to 60 A/dm$^2$; voltage is from 1V to 100V; and duration of electrolysis is from 10 seconds to 5 minutes. A quantity of a film formed by the anodizing treatment is preferably 1.0 g/m$^2$ or more and more preferably in a range of from 2.0 g/m$^2$ to 6.0 g/m$^2$. If the quantity of the film formed by the anodizing treatment is less than 1.0 g/m$^2$, the surface does not have sufficient printing durability and the non-image portion of the planographic printing plate is liable to form a scratch mark, which tends to collect printing ink during a printing operation to cause so-called "scratch smudging".

After this aluminum support is anodized, it can be further treated with an organic acid or a salt thereof or coated with an undercoat layer for use in coating the image recording layer, are used.

Further, in order to enhance the adhesiveness between the support and the image recording layer, an intermediate layer may be provided. The intermediate layer for the purpose of enhancing the adhesiveness generally comprises a diazo resin, a phosphoric acid compound adsorbed on, for example, aluminum and the like. Thickness of the intermediate layer can be set as desired, but it is necessary for the intermediate layer to have the thickness which allows a uniform bonding reaction with an overlaid image recording layer to be performed when exposed to light. Ordinarily, a coating ratio on a dry solid basis is preferably from about 1 mg/m$^2$ to about 100 mg/m$^2$ and particularly preferably from 5 mg/m$^2$ to 40 mg/m$^2$. A ratio of the diazo resin to be used in the intermediate layer is from 30% to 100% and preferably from 60% to 100%.

After the above-described treatment, undercoating or the like is performed on the surface of the support, the above-described backcoat layer is provided on a back surface of the support.

As preferable characteristics of the support for the planographic printing plate, a centerline average roughness is from 0.10 μm to 1.2 μm. When the centerline average roughness is less than 0.10 μm, the adhesiveness to the image recording layer is deteriorated to decrease printing durability remarkably. When it is more than 1.2 μm, smudge resistance at the time of printing is deteriorated. Further, a color density of the support is from 0.15 to 0.65 as a reflection density value; when the color density is in a white-color side than 0.15, a halation at the time of image exposure is overly intense and causes a problem in forming the image, while, when it is more black-color side than 0.65, the image is not easily observed at the time of inspecting the printing plate after subjected to development to cause a problem that an inspection work of the printing plate is remarkably deteriorated.

Under these circumstances, the image recording material according to the invention can be prepared. This image recording material can be recorded by using an infrared laser. Further, it is also capable of being thermally recorded by using an ultraviolet lamp or a thermal head. According to the invention, it is preferable that an image exposure is performed by using a solid laser or a semiconductor laser which emits an infrared ray having a wavelength of from 760 nm to 1200 nm. An output of the laser is preferably 100 mW or more, and, in order to reduce exposure time, a multi-beam laser device is preferably used. Further, the exposure time per pixel is preferably within 20 microseconds. Further, a quantity of energy to be irradiated on the recording material is preferably from 10 mj/cm$^2$ to 300 mj/cm$^2$.

After the image recording material according to the invention is exposed by using an infrared laser, it is subjected to development processing by, preferably, water or an aqueous alkaline solution.

When the aqueous alkaline solution is used as a developer, a conventionally known aqueous alkaline solution can be used as a developer and as a replenishing solution for development of the image recording material according to the invention. Examples of such aqueous alkaline solutions include inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide, lithium hydroxide and the like, and, further, include organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylene diamine, pyridine and the like. These aqueous alkaline solutions may be used each individually or in any combination of two or more thereof.

It is known that, when development is performed by using an automatic processor, a large number of the planographic printing plate precursors can be processed without changing developers in a developer tank for a long period of time by adding to the developer the same developer or an aqueous solution (a replenishing solution) having a higher alkali strength than the developer. According to the invention, such a replenishing method can also be preferably used.

For the purposes of accelerating or suppressing development, dispersing sludge resulting from development, and enhancement of the affinity of the image portions of the printing plate for ink, various types of surfactants, organic solvents or the like can be added to the developer and the replenishing solution as occasion demands. Examples of preferable surfactants include anionic surfactants, cationic surfactants, nonionic surfactants and amphoteric surfactants. Examples of preferable organic solvents includes benzyl alcohol. Further, polyethylene glycol and derivatives thereof, and polypropylene glycol and derivatives thereof may favorably be added. Furthermore, a non-reducing sugar such as arabitol, sorbitol, mannitol or the like can also be added.

Further, if necessary, hydroquinone, resorcinol, an inorganic salt-based reducing agent such as a sodium salt or potassium salt of sulfurous acid or hydrogen sulfurous acid, and, further, an organic carboxylic acid, a defoaming agent, and a water softener can be added to the developer or the replenishing solution.

The printing plate which has been developed with the developer and the replenishing solution described above is subjected to a post-treatment such as a treatment with rinsing water, a treatment with a rinsing solution containing a surfactant or the like, or a treatment with an oil-desensitizing solution containing gum arabic or a starch derivative and, then, the printing plate thus-post treated is subjected to a post-heating treatment which is characteristic to the invention.

In recent years, in plate forming and printing industries, an automatic processor for processing a printing plate has widely been used for the purpose of rationalization and standardization of the plate forming. The automatic processor ordinarily comprises a developing section and a post-treatment section and further comprises a device for transferring the printing plate, a processing liquid tank for each processing liquid and a spraying device. While an exposed printing plate is transferred horizontally, it is developed each processing liquid sprayed from a nozzle after being pumped up from the processing liquid tank. Further, a method is also known, in which the printing plate is immersed in and transferred through a processing tank containing the processing liquid by means of an immersed guide roll or the like. In this type of automatic processing, processing can be performed while supplying the replenishing solution to the processing liquid in accordance with a treated quantity, an operating time or the like. Further, such supply can be performed by sensing an electric conductivity by a sensor.

Furthermore, a so-called disposable processing system, in which a printing plate is processed with a substantially unused processing liquid, can also be employed.

The planographic printing plate thus-obtained, to which the negative image recording material according to the invention is applied, is coated with an oil-desensitizing gum if necessary, and can be sent to a printing process. The planographic printing plate, which has been image formed via a predetermined process, is mounted on an offset printing machine or the like and is then used for printing a large number of sheets.

EXAMPLES

Next, examples of the present invention will be explained, but it should be noted that the invention is not limited to these examples.

Examples 1 to 5

Preparation of Support

An aluminum plate (material quality: JIS 1050 described above) having a thickness of 0.30 mm was cleaned with trichloroethylene and degreased, and thereafter, the thus-degreased plate was roughened with a nylon brush and an aqueous suspension of 400 mesh pumice powder. After being rinsed well with water, the aluminum plate was etched by immersing the aluminum plate in an aqueous solution of 25% sodium hydroxide (at 45° C.) for 9 seconds, rinsing the aluminum plate with water, immersing the aluminum plate in an aqueous solution of 2% nitric acid for 20 seconds and rinsing the aluminum plate with water. In the process, an etched quantity of the grained aluminum plate was about 3 g/m².

Next, the aluminum plate was subjected to an anodizing process comprising immersing the aluminum plate in a 7% sulfuric acid solution as an electrolyte solution through which a direct current having a current density of 15 A/dm² was passed. This process produced an anodized film of 3 g/m². Then, the surface-treated aluminum plate was rinsed with water, dried, coated with a coating liquid for an undercoat layer to be described below and dried under an atmosphere of 80° C. for 30 seconds. A dry coated amount was 10 mg/m².

Coating Liquid for Undercoat Layer

Compounds in a composition described below were mixed to prepare a coating liquid for an undercoat layer.

| | |
|---|---|
| copolymer of ethylacrylate and sodium 2-acrylamide-2-methyl-1-propane sulfonate at a molar ratio of 75:15 | 0.1 g |
| 2-aminoethylphosphonic acid | 0.1 g |
| methanol | 50 g |
| ion-exchanged water | 50 g |

Formation of Image Recording Layer

Next, coating liquids [P-1] to [P-5] for image recording layers as described below were prepared by changing types of the (C) amide-acid compounds as are shown in the following table 1 respectively and then, the coating liquids thus-prepared were applied on the above-prepared undercoated aluminum plate by using a wire bar, dried at 115° C. for 45 seconds in a hot air-type dryer to form an image recording layer to obtain planographic printing plate precursors [P-1] to [P-5] were obtained. Coated quantities thereof were from 1.2 g/m² to 1.3 g/m² on a dry amount basis.

Coating Liquid [P-1] for Image Recording Layer

| | |
|---|---|
| (C) amide-acid compound (compounds shown in Table 1) (weight average molecular weight: 80000 to 100000) | 0.3 g |
| tris(acryloxyethyl)isocyanate | 0.9 g |
| (D) infrared absorbing agent (structure described below) | 0.08 g |
| (A) polymerization initiator (structure described below) | 0.25 g |
| (B) Polymerizable polymer (structure described below) (component molar ratio: 35/20/30/15; weight average molecular weight: 110,000) | 1.2 g |
| naphthalene-sulfonate of Victoria Pure Blue | 0.05 g |
| fluorine-type surfactant (trade name: Megafac F-475 manufactured by Dainippon Ink and Chemicals, Inc.) | 0.02 g |
| methyl ethyl ketone | 10 g |
| methanol | 5 g |
| 1-methoxy-2-propanol | 12 g |

TABLE 1

| | Example 1 | Example 2 | Example 3 | Example 4 | Example 5 | Comparative Example 1 |
|---|---|---|---|---|---|---|
| Planographic printing plate | [P-1] | [P-2] | [P-3] | [P-4] | [P-5] | [Q-1] |
| Amide-acid compound | AMP-5 | AMP-1 | AMP-6 | AMP-7 | AMP-9 | — |
| Evaluation result | | | | | | |
| Printing durability | good | good | good | good | good | decrease of density in image portion |
| Image quality | 50000 sheets | 60000 sheets | 65000 sheets | 55000 sheets | 70000 sheets | 40000 sheets |

Infrared Absorbing Agent

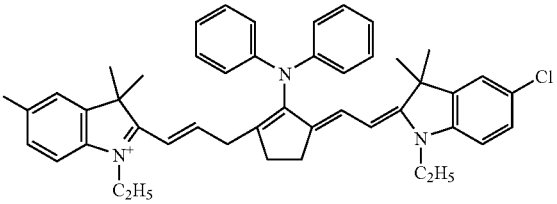

Polymerization Initiator

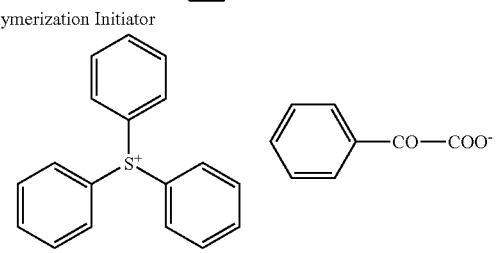

-continued

Polymerizable polymer

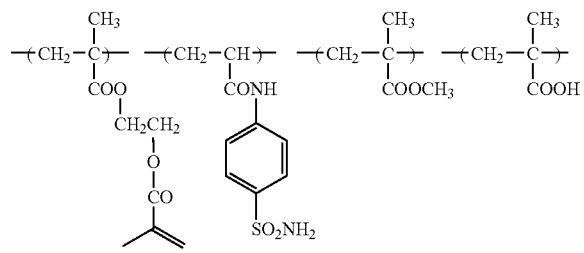

(component molar ratio = 35/20/30/15; weight average molecular weight: 110,000)

Evaluation of Planographic Printing Plate Precursor

Next, the planographic printing plate precursor was plate forming processed by using a CTP output system fabricated by Fuji Photo Film Co., Ltd. comprising a printing plate supply apparatus (trade name: SA-L8000), an exposure apparatus (trade name: Luxel T-9000CTP), a conveyor (trade name: T-9000 Conveyor), an automatic processor (trade name: LP-1310H), and a stocker (trade name: ST-1160) to obtain planographic printing plates [P-1] to [P-5]. Further, a processing tank was filled with a developer having the composition described below and kept at 30° C. A second tank was filled with tap water and a third tank in the automatic processor was filled a finishing gum liquid in which FP-2W (trade name; available from Fuji Photo Film Co., Ltd.) was diluted with water at a ratio of 1:1.

Developer

| | |
|---|---|
| sodium sulfite | 0.1% by mass |
| potassium hydroxide | 0.06% by mass |
| potassium carbonate | 0.2% by mass |
| ethylene glycol mononaphthyl ethr | 4.8% by mass |
| EDTA-4 Na salt | 0.13% by mass |
| water | 94.8% by mass |

A printing operation was performed by using an ecoink available in the market and by utilizing the thus-obtained planographic printing precursors [P-1] to [P-5] which were mounted on a printing machine Rislon (trade name) manufactured by Komori Printing Machine K. K. When an image of the resultant printed matter was evaluated with a visual inspection, neither a blank area in the image portion nor smudge derived from a residual film in the non-image portion had occured, and an image having an excellent quality was formed. Thereafter, the printing operation was continued, cleaning a surface of the printing plate during the printing operation by using a multi-cleaner manufactured by Fuji Photo Film Co., Ltd. every time 1000 sheets were printed. Evaluations were performed by visually counting a number of sheets of the printed matter, on which a sufficient deposition of ink had been printed. The results are shown in Table 1 as described above.

Comparative Example 1

A [Q-1] of a planographic printing plate precursor was prepared in a same manner as in Examples 1 to 5 except that (C) the amide-acid compound was excluded from the coating liquids [P-1] to [P-5] for the image recording layers.

An image was formed on the planographic printing plate precursor [Q-1] thus-prepared in the same manner as in Example 1 and an evaluation of printing durability was performed thereon. The results are shown in Table 1.

As is apparent from the results shown in Table 1, any of the planographic printing plates which used the image recording material according to the invention was capable of forming an image having a high quality and also had excellent printing durability. On the other hand, Comparative Example 1, which does not contain (C) the amide-acid compound on the surface of the image recording layer, exhibited a density decrease in the image portion caused by a decrease in a film thickness and was found to have a low printing durability compared with the Examples.

According to the invention, a negative image recording material, which can be direct image recorded from digital data provided by a computer or the like, by recording using a solid laser or a semiconductor laser which emits an infrared ray, and in which negative image recording material generation of a scratch on the surface and decrease of a film thickness at the time of development are suppressed and an image to be obtained is excellent in quality and printing durability, can be provided.

What is claimed is:

1. A negative image recording material comprising an aluminum support and an image recording layer disposed on the support, the image recording layer comprising an amide-acid compound, the amide-acid compound containing a carboxyl group and an amide group, wherein said amide-acid compound comprises a polymer having a unit represented by General Formula (4):

General Formula (4)

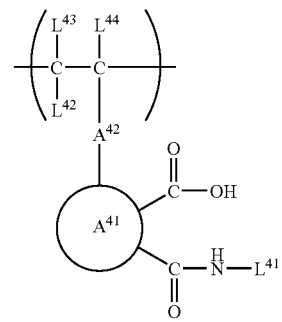

wherein $L^{41}$, $L^{42}$, $L^{43}$ and $L^{44}$ may be same or different and each independently represents a hydrogen atom or a hydrocarbon group having 30 or fewer carbon atoms which may have a substituent or a covalent bond;

wherein $A^{41}$ represents a hydrocarbon group having 30 or fewer carbon atoms which may have a substituent or a covalent bond; and $A^{42}$ represents a covalent bond, an ester bond, an amide bond, an ether bond or a hydrocarbon group having 30 or fewer carbon atoms;

wherein said amide-acid compound becomes insoluble by a thermal ring-closure reaction between said carboxyl group and said amide group;

and wherein the quantity of said amide-acid compound is in a range of from approximately 0.1% by mass to approximately 50% by mass, based on an entire solid content of a coating liquid for the image recording layer.

2. The negative image recording material as set forth in claim 1, wherein the image recording layer further comprising a polymerization initiator and a polymerizable compound.

3. The negative image recording material as set forth in claim 1, wherein the image recording layer further comprises a binder polymer.

4. The negative image recording material according to claim 1, wherein said image recording layer further comprises a light absorbing agent.

5. The negative image recording material as set forth in claim 4, wherein said light absorbing agent is an infrared ray absorbing agent.

6. The negative image recording material as set forth in claim 1, wherein said polymerization initiator is an onium salt.

7. The negative image recording material as set forth in claim 6, wherein said polymerization initiator is at least one onium salt selected from the group consisting of onium salts expressed by the following General Formulas (III) to (V):

General Formula (III):

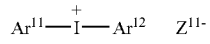

General Formula (IV):

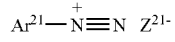

General Formula (V):

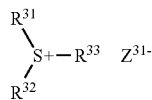

wherein $Ar^{11}$ and $Ar^{12}$ each independently represents an aryl group having 20 or fewer carbon atoms which may have a substituent;

$Ar^{21}$ represents an aryl group having 20 or fewer carbon atoms which may have a substituent; and $R^{31}$, $R^{32}$ and $R^{33}$ may be the same or different from one another and each independently represents an aryl group having 20 or fewer carbon atoms which may have a substituent.

8. The negative image recording material as set forth in claim 1, wherein the coating amount of said image recording layer is in a range of from approximately 0.1 g/m² to approximately 5.0 g/m².

9. A negative image recording material comprising:
an aluminum support;
an image recording layer disposed on said support, the image recording layer containing a polymerization initiator and a polymerizable compound; and
an overcoat layer disposed on said image recording layer, the overcoat layer containing an amide-acid compound containing a carboxyl group and an amide group,
wherein said amide-acid compound comprises a polymer having a unit represented by General Formula (4):

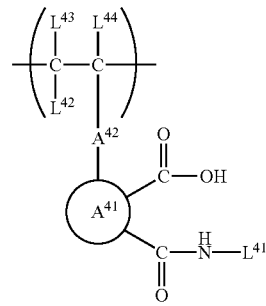

General Formula (4)

wherein $L^{41}$, $L^{42}$, $L^{43}$ and $L^{44}$ may be same or different and each independently represents a hydrogen atom or a hydrocarbon group having 30 or fewer carbon atoms which may have a substituent or a covalent bond;

wherein $A^{41}$ represents a hydrocarbon group having 30 or fewer carbon atoms which may have a substituent or a covalent bond; and $A^{42}$ represents a covalent bond, an ester bond, an amide bond, an ether bond or a hydrocarbon group having 30 or fewer carbon atoms; and wherein said amide-acid compound becomes insoluble by a thermal ring-closure reaction between said carboxyl group and said amide group.

10. The negative image recording material as set forth in claim 9, wherein the overcoat layer further comprises a binder polymer.

11. The negative image recording material as set forth in claim 9, wherein the image recording layer further comprises a binder polymer.

12. The negative image recording material according to claim 9, wherein said image recording layer further comprises a light absorbing agent.

13. The negative image recording material as set forth in claim 9, wherein said light absorbing agent is an infrared ray absorbing agent.

14. The negative image recording material as set forth in claim 9, wherein said polymerization initiator is an onium salt.

15. The negative image recording material as set forth in claim 14, wherein said polymerization initiator is at least one onium salt selected from the group consisting of onium salts expressed by the following General Formulas (III) to (V):

General Formula (III):

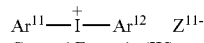

General Formula (IV):

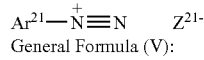

General Formula (V):

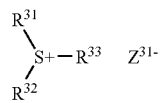

wherein $Ar^{11}$ and $Ar^{42}$ each independently represents an aryl group having 20 or fewer carbon atoms which may have a substituent;

Ar$^{21}$ represents an aryl group having 20 or fewer carbon atoms which may have a substituent; and R$^{31}$, R$^{32}$ and R$^{33}$ may be the same or different from one another and each independently represents an aryl group having 20 or fewer carbon atoms which may have a substituent.

16. The negative image recording material as set forth in claim 9, wherein a quantity of said amide-acid compound is in a range of from approximately 0.1% by mass to approximately 50% by mass, based on an entire solid content of said overcoat layer.

17. The negative image recording material as set forth in claim 9, wherein the coating amount of said overcoat layer is in a range of from approximately 0.1 g/m$^2$ to approximately 3.0 g/m$^2$.

18. The negative image recording material as set forth in claim 1, wherein $n_{21}$ represents 0 or 1.

19. The negative image recording material as set forth in claim 9, wherein $n_{21}$ represents 0 or 1.

* * * * *